United States Patent [19]

Dimock et al.

[11] Patent Number: 4,522,697

[45] Date of Patent: Jun. 11, 1985

[54] WAFER PROCESSING MACHINE

[75] Inventors: Jack A. Dimock; Peter J. Clarke, both of Santa Barbara, Calif.

[73] Assignee: Sputtered Films, Inc., Santa Barbara, Calif.

[21] Appl. No.: 564,740

[22] Filed: Dec. 22, 1983

[51] Int. Cl.³ .............................................. C23C 15/00
[52] U.S. Cl. ...................................... 204/298; 118/50; 118/724; 204/192 R; 204/192 E; 414/217; 414/222; 414/225; 414/416; 414/417
[58] Field of Search ............... 204/298, 192 R, 192 E; 414/217, 417, 222, 225, 416; 118/50, 724

[56] References Cited

U.S. PATENT DOCUMENTS 3,856,654 12/1974 George ................................. 204/298
3,921,788 11/1975 Roberson et al. ................... 414/417
4,311,427 1/1982 Coad et al. .......................... 204/298

Primary Examiner—Arthur P. Demers
Attorney, Agent, or Firm—Harry E. Aine

[57] ABSTRACT

A sputter coating machine (11) includes a rectilinearly translatable load-lock door (16) closing off one end of a vacuumable chamber (12). Wafers (21) to be coated are loaded and unloaded by an elevated blade (24) onto a chuck (57) carried from the inside surface of the door (16). A clamping ring (85) clamps the wafer (21) to the chuck (57) and advances the wafer (21) to the open throat of a gate-valve portion (15) of the chamber (12) into position opposite a magnetron-sputter gun (105) carried from a second door end of the chamber (12). The second door (13) is moveable away from the chamber (12) on guide rails (141) and pivotable about an axis (138) for ease of maintenance.

12 Claims, 10 Drawing Figures

U.S. Patent   Jun. 11, 1985   Sheet 1 of 4   4,522,697
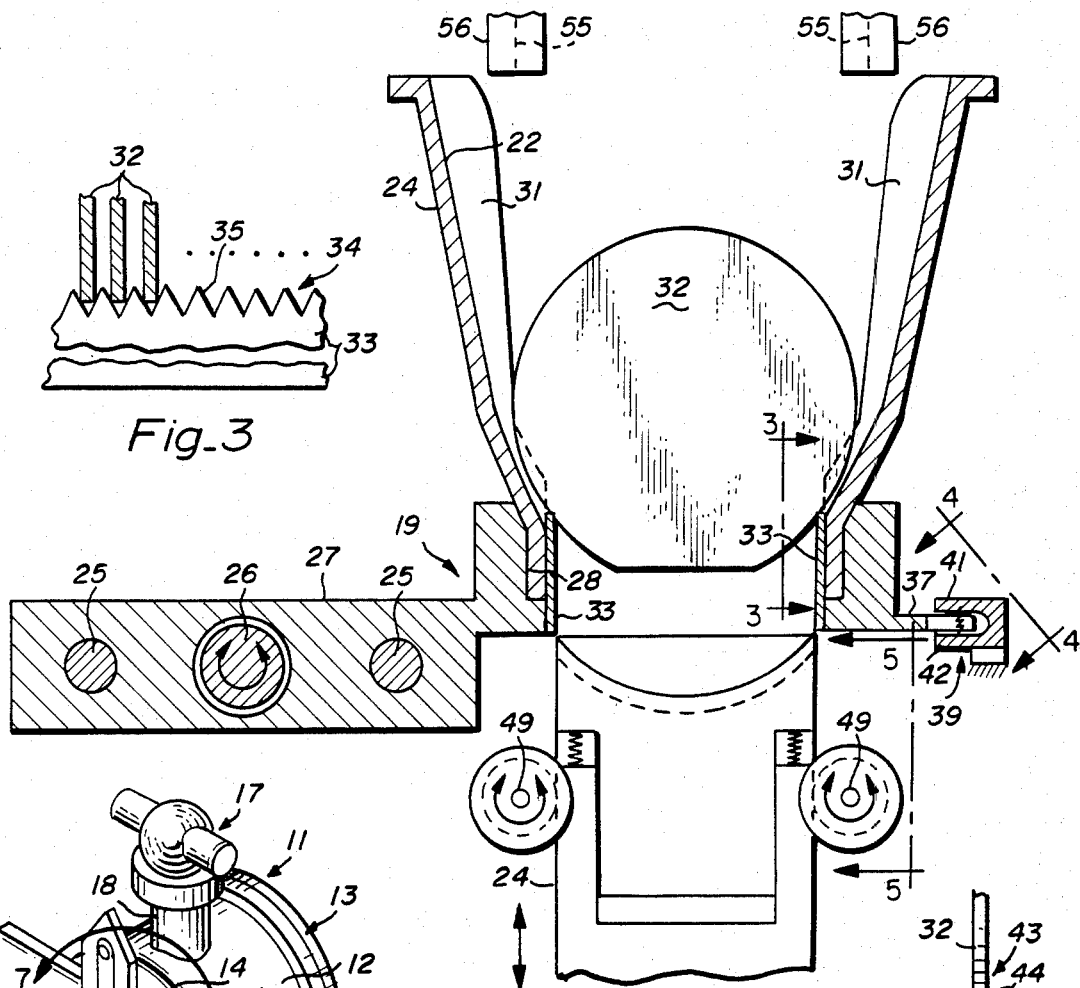
Fig_3
Fig_2
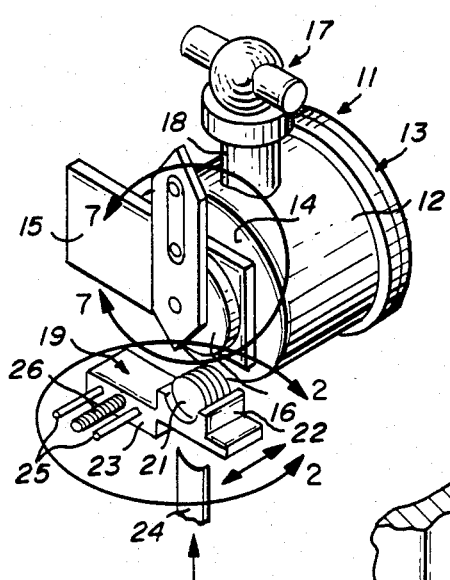
Fig_1
Fig_4
Fig_5

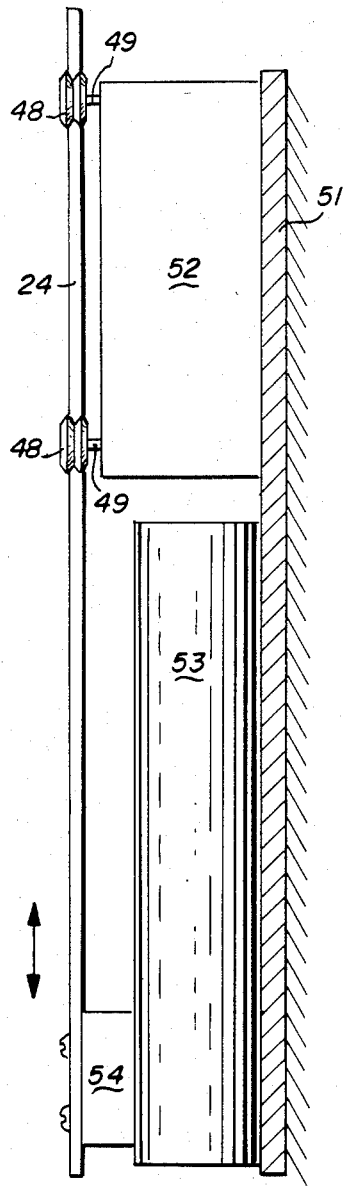
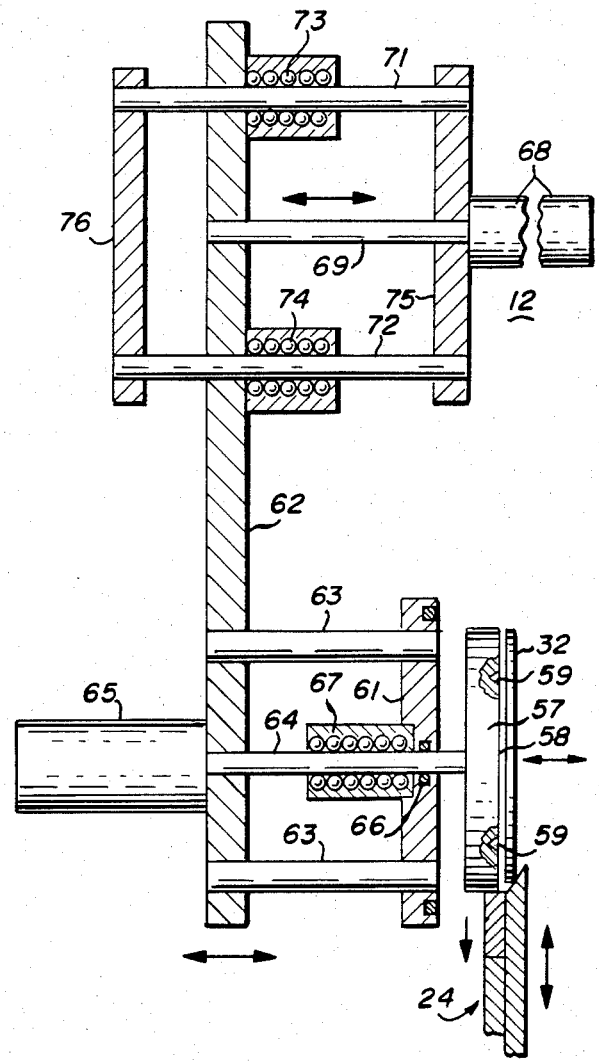
Fig_6
Fig_7

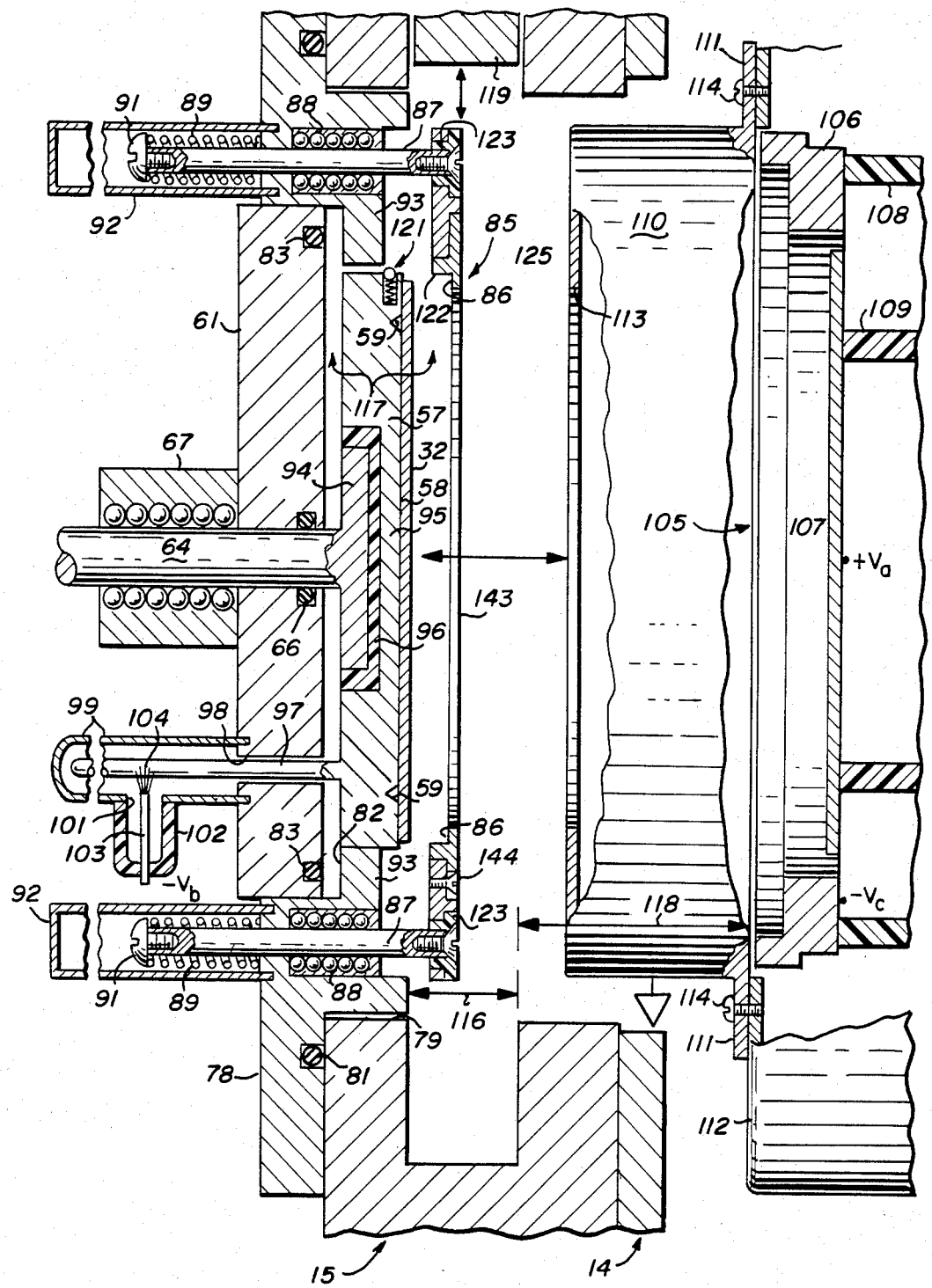
Fig_8

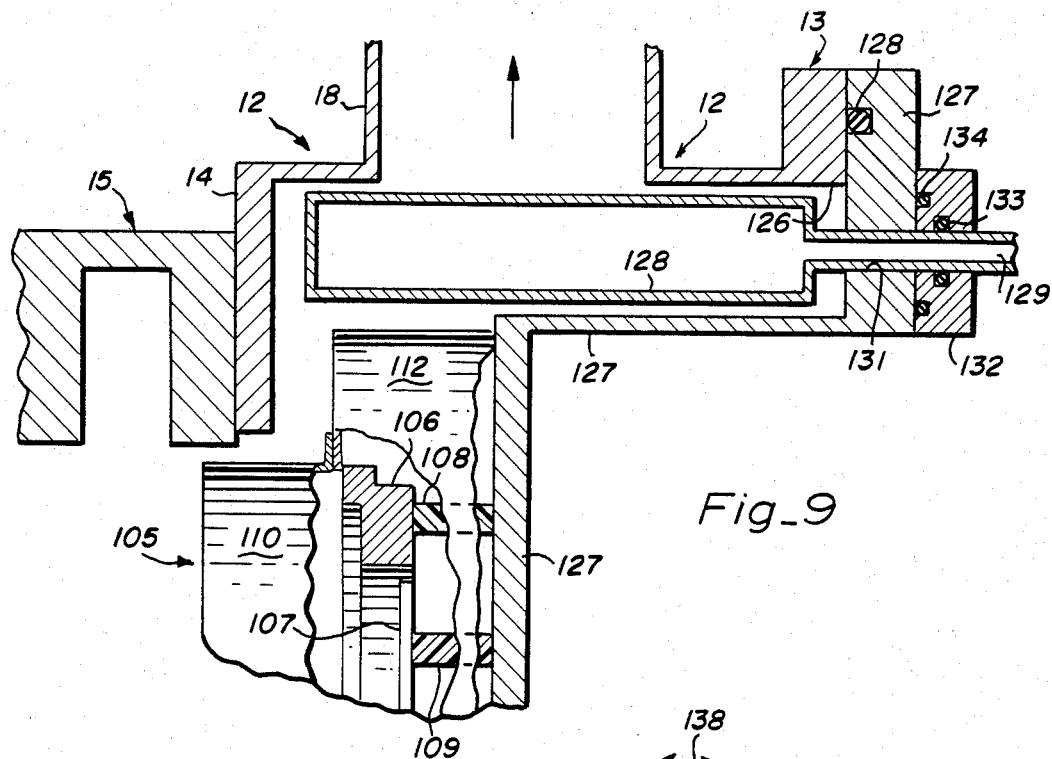
Fig_9
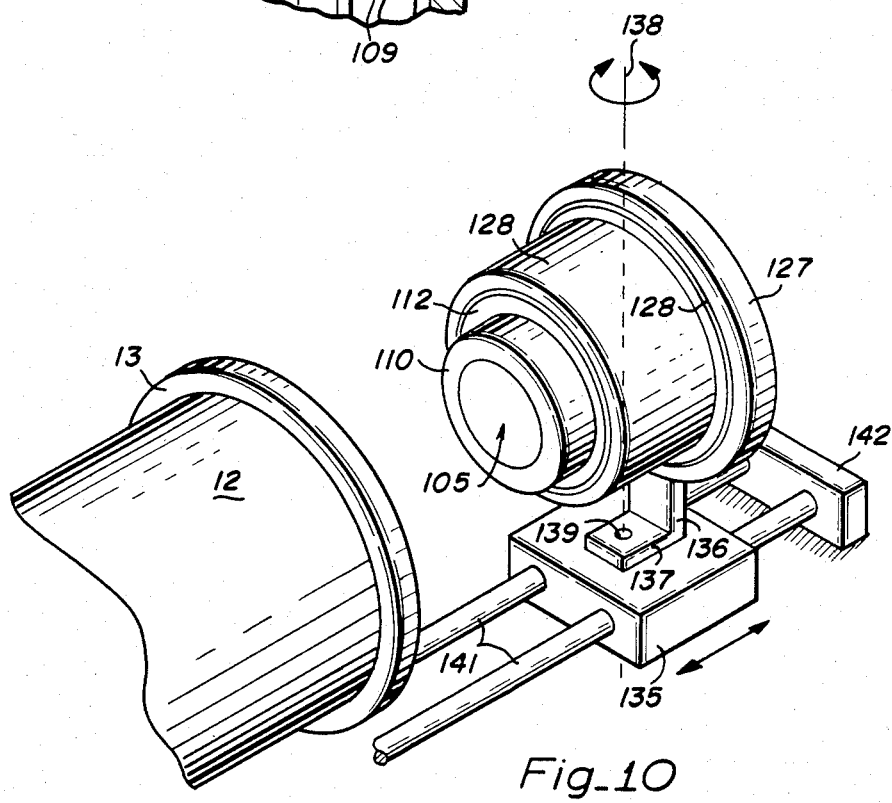
Fig_10

WAFER PROCESSING MACHINE

BACKGROUND OF THE INVENTION

The present invention relates in general to wafer processing machines and more particularly to machines of the character operating at sub-atmospheric pressure such as sputter coating machines.

DESCRIPTION OF THE PRIOR ART

Heretofore, sputter coating machines have been proposed wherein wafers contained in a special wafer carrier are sequentially lifted into a load-lock mechanism of the sputter coating machine by means of an elevator blade. The wafers are loaded by the blade onto a vacuum chuck forming a portion of a door to the load-lock portion of the vacuum chamber. The door is swung closed, and the chuck, holding the wafer, translates the wafer into an edge gripping clip assembly carried from an apertured lazy susan type rotary member within the evacuated chamber. The aperture in the lazy susan plate opposite the load-lock station is sealed by means of a plunger and the load lock is evacuated to a relatively low pressure by means of a roughing pump. When a suitably low pressure is attained, the sealing plunger is opened exposing the wafer to the processing portion of the evacuated chamber, which is in communication with a high-vacuum pump. The pressure is then reduced to a relatively low pressure and backfilled with argon to a sputtering pressure as of $10^{-3}$ torr. When the lazy susan is rotated, it advances a previously loaded wafer into a sputtering position opposite a sputter gun, which then coats the previously loaded wafer by sputtering. After coating the previously loaded wafer, the lazy susan rotates the coated wafer into the load-lock, the aperture in the lazy susan is then sealed off from the processing portion of the chamber and the load lock raised to atmospheric pressure. At this point the vacuum chuck translates into the clip assembly and picks up the coated wafer. The door swings open, the blade picks up the wafer from the chuck and returns the coated wafer to the wafer carrier in its original position. The lazy susan has a number of different stations so that the wafer can be heated, and sputter coated with a number of different materials before exiting the wafer coating machine.

Such a wafer coating machine is disclosed in U.S. Pat. No. 4,311,427 issued Jan. 19, 1982, the disclosure of which is hereby incorporated by reference in its entirety.

One of the problems with the prior art sputter coating machine is that it is relatively complicated, therefore relatively expensive and unreliable. The spring clip arrangement for holding the wafers at their edge produces undesired stresses on the wafer which can result in undue breakage and down-time for the machine. It would be desirable to provide a less complicated, less costly and more reliable wafer coating machine.

SUMMARY OF THE PRESENT INVENTION

The principal object of the present invention is the provision of an improved wafer processing machine, and particularly one operating at sub-atmospheric pressure, such as a wafer coating machine.

In one feature of the present invention, wafers are precisely indexed within the slots of a standard wafer carrier by means of a serrated structure passing into the wafer carrier through the open bottom and engaging and slightly lifting the wafers within the carrier so as to precisely determine the position of the wafers within the wafer carrier.

In another feature of the present invention, a load-lock portion of the evacuable wafer processing chamber is separated from a wafer processing or coating portion of the evacuable chamber by means of a gate-valve with the wafer being translatable through the open throat of the gate-valve into the wafer processing portion of the evacuable chamber.

In another feature of the present invention, the wafer clamping means, for clamping the wafer to the processing chuck, includes a detachable face portion facing away from the wafer and toward the source of coating material, such that the coated portion of the clamping structure can be readily removed to facilitate cleaning.

In another feature of the present invention, a sputter shield is disposed between the sputter gun and the wafer for collecting sputtered material projecting away from the gun and not collected by the workpiece, whereby resputtering of material on the wafer from undesired portions of the chamber is eliminated in use.

In another feature of the present invention, the sputter shield includes a centrally apertured end closing wall remote from the gun with the wafer to be coated positioned essentially coextensive with the area of the central aperture so as to collect substantially all of the sputtered material either on the wafer to be coated or on the sputter shield.

In another feature of the present invention, the coating gun is carried from a cover closing and sealing an access port in the evacuable chamber and a cold finger is carried from the cover and extending into the chamber for condensing water vapor and other condensibles thereon in use.

In another feature of the present invention, the cold finger is generally arcuate and disposed generally concentric with and outside of the coating gun, as carried from the access port cover.

Other features and advantages of the present invention will become apparent upon a perusal of the following specification taken in connection with the accompanying drawings wherein:

BRIEF DESCRIPTION OF THE DRAWINGS

FIG. 1 is a schematic perspective view of a wafer coating machine incorporating features of the present invention;

FIG. 2 is a transverse sectional view of a portion of the structure of FIG. 1 delineated by line 2—2;

FIG. 3 is an enlarged view of the structure of FIG. 2 taken along line 3—3 in the direction of the arrows;

FIG. 4 is an enlarged perspective view of a portion of the structure of FIG. 2 taken along line 4—4 in the direction of the arrows;

FIG. 5 is an enlarged view of a portion of the structure of FIG. 2 taken along line 5—5 in the direction of the arrows;

FIG. 6 is a side elevational view of the wafer elevator blade assembly portion of the coating machine of the present invention;

FIG. 7 is an enlarged sectional view of a portion of the structure of FIG. 1 delineated by line 7—7;

FIG. 8 is a longitudinal sectional view of the load lock and deposition portions of the vacuum chamber of the coating machine of FIG. 1;

FIG. 9 is a fragmentary longitudinal sectional view of a portion of the deposition chamber of the present invention, and FIG. 10 is a perspective view of a portion of the coating machine of the present invention depicting the access cover with dependent sputter gun moved out for access and maintenance of the coating machine.

DESCRIPTION OF PREFERRED EMBODIMENTS

Referring now to FIG. 1, there is shown a sputter coating machine 11 incorporating features of the present invention. More particularly, the machine includes a cylindrical processing chamber, portion 12, closed on one end by means of a flanged cover, 13, which supports and carries the sputter coating gun internally of the chamber, 12. The other end of the chamber, 12 is closed by a centrally apertured end closing wall, 14. The central aperture is closed by means of a gate-valve assembly, 15, for valving off a processing portion of the chamber from a load lock portion of the processing machine. An axially translatable door, 16, closes off the other end of the throat of the gate-valve, 15. A turbo-molecular vacuum pump, 17, sits on top of the process chamber, 12, and communicates with its interior via a conduit, 18.

A wafer carriage assembly, 19, is disposed below and adjacent to the door, 16. Wafers, 21, to be processed by the machine, 11, are carried within a standard wafer carrier, 22, inserted into a recess in a wafer carriage assembly, 23, which is axially translatable relative to an elevator blade, 24, which passes up through the bottom of the wafer carrier, 22, and out the top for lifting and positioning a respective wafer adjacent to a wafer chuck carried from the inside of the load lock door, 16. The wafer carriage, 23, slides on a pair of horizontal guide rods, 25, and is moved along the guide rods, 25, by means of a motor driven screw, 26, for sequentially advancing respective ones of the wafers over the blade, 24, for transport to and from the wafer processing machine, 11.

Referring now to FIG. 2, the wafer carriage assembly, 19, is shown in greater detail. Wafer carriage assembly, 19, includes a carriage member, 27, axially translatable of the chamber, 12, on a pair of guide rods, 25, affixed at the ends to a frame structure which supports the wafer processing machine, 11, from the floor. A drive screw, 26, threadably mates with the carriage, 27, for driving the carriage, 27, on the guide rods, 25. The drive screw, 26, is turned by means of a conventional stepping motor. The carriage member, 27, includes a wafer receptacle portion having a rectangular recess, 28, to receive the generally rectangular lower frame portion of a conventional wafer carrier, 22. In a typical example, wafer carrier, 22, is a model PA72-50M for 5" wafers or a model PA72-40M for 4" wafers commercially available from Fluoroware Inc. The wafer carrier, 22, includes outwardly flared side-wall portions, 29, having an array of wafer receiving slots, 31, formed therein to receive and hold silicon wafers, 32, in axially aligned and axially spaced relation. In a typical example, the center to center axial spacing between wafers is 0.187 inches and the wafers have a thickness as of 0.026 inches. In the standard wafer carrier, 22, the individual wafer retaining slots, 31, have an axial extent of approximately 0.060 inches. It is desired to precisely locate the individual wafers, 32, within the respective slots, 31, so that the axial spacing between wafers is precisely determined so that the individual wafers can be precisely located in vertical registration over the elevator blade, 24, having a thickness as of 0.250 inch. To precisely locate the individual wafers, 32, within the respective slots, 31, a pair of wafer indexing blades, 33, are carried from the carriage member, 27, and extend adjacent to the inside wall of the wafer carrier, 22, at the bottom thereof. The upper edge, 34, of each of the indexing blades, 32, is serrated as shown at 35, in FIG. 3 in a generally sawtooth configuration to engage the bottom edge of the respective wafers, 32, and to lift the wafers, 32, slightly within the wafer carrier, 22. The pitch of the sawtooth serration in the blade, 33, is made to precisely determine the desired axial separation of the respective wafers, 32. The individual wafers, 32, are pre-aligned with the major alignment flat, 36, at the 6 o'clock position by conventional roller flat alignment means, not shown.

The wafer carriage structure, 27, includes a longitudinally directed thin flange portion, 37, shown in FIG. 4. The outer edge of the longitudinal flange, 37, is transversely slotted at 38, to form a linear array of wafer indexing indicia formed by the optically transparent portions of the flange formed by the slots, 38.

The slots 38 have a pitch, i.e. a spacing, equal to the spacing or pitch of the serations in the serrated edge of the indexing blade 33. An optical readout device 39 straddles the slotted flange 37 and is fixedly secured to the frame which supports the coating maching 11 from the floor. When the wafer carriage assembly 27 is translated to a position such that an optically transparent path is obtained between an optical transmitting portion 41 and an optical receiving portion 42 of the optical readout device 39, the electrical circuit is completed which produces an output signal for stopping translation of the wafer carriage 27 so that the respective wafers are sequentially advanced to positions in precise vertical alignment with the elevator blade 24.

Referring now to FIGS. 2, 5, 6 and 7 the wafer loading mechanism will be described in greater detail. More particularly, the wafer elevator blade 24 includes an upper leadilng edge portion 43 which engages the bottom edge of the respective wafer 32. The leading edge portion 43 includes a bevelled portion 44 which causes the edge of the wafer 32 to be gripped between the bevelled surface 44 and the inside wall 45 of a retractable portion 46 of the elevator blade 24. The side edges of the elevator blade 24 are bevelled at 46 so as to center the edge of the blade 44 in a groove 47 of rollers 48 carried on axles 49 from the frame structure 51 via a support bracket 52. Rollers 48 guide the vertical movement of the blade 24. The blade is moved vertically by means of a rodless pneumatic cylinder 53 fixedly secured to the frame 51 and available from Origa Corporation of Elmhurst, Ill. The blade 24 is afixed to the piston within the cylinder 53 by a coupling member 54 which passes axially of the cylinder 53 in a slot sealed by means of stainless steel bands. In a typical example, the rodless cylinder 53 provides 14 inches of vertical lift to the blade 24.

As the blade 24 is elevated it picks up the lower edge of the wafer 32 and carries the wafer 32 upwardly into guide slots 55 provided in guide rails 56 fixedly secured to and carried from the load lock end of the coating machine 11.

The elevator blade 24 continues its upward movement until the wafer 32 is positioned overlying a wafer receiving and holding major face 58 of a wafer chuck 57. Wafer receiving face 58 of the chuck includes an annular V groove 59 connected in fluid communication with a source of gas. Gas flowing into the V groove when the wafer 32 is brought into close proximity produces a Bernouli effect causing the wafer 32 to be sucked toward the major face 58 of the chuck 57. When the retractable portion 46 of the blade 24 engages the lower periphery of the chuck 57 the retractable portion 46 retracts allowing the wafer 32 to move into completely supported arrangement relative to the chuck 57, i.e. the area of the wafer is completely coextensive with the area of the major face 58 of the chuck with the periphery of the wafer being recessed by approximately 0.020 inch relative to the outer periphery of the chuck 57. When the blade 24 has been elevated to its upper most extent and the wafer positioned properly relative to the chuck, positive flow of gas to the V groove 59 is terminated by means of suitable valves and a vacuum is drawn on the V groove so as to hold the wafer 32 to the major face 58 of the chuck 57. The blade 24 is then withdrawn back through the wafer carrier to its lower most extent of travel as shown in FIG. 2.

When it is desired to remove a wafer 32 from the vacuum chuck 57 the elevator blade 24 is raised to its upper most extent of travel as shown in FIG. 7, the V groove 59 is pressurized for a flow of gas and the blade 24 withdrawn downwardly such that the wafer 32 by gravity falls into the holding position as shown in FIG. 5. The blade 24 with wafer 32 is withdrawn down through the guide slots 55 into the respective slot 31 of the wafer carrier 22.

Referring now to FIGS. 7 and 8 the operation of the wafer chuck is shown in greater detail. More particularly, the chuck 57 is carried from a circular door structure 61 which in turn is carried from an actuator plate 62 via rods 63.

The wafer chuck 57 is carried on an axially translatable rod 64 passing through a central aperture in the door 61 and into a pneumatic actuating cylinder 65 for axially translation of the rod 64 and chuck 57. The actuating rod 64 is vacuum sealed to the door 61 via an O-ring 66 and precise axially translation of the rod 64 relative to the door 61 is obtained by means of linear ball bearing assembly 67 riding on the rod 64 and carried from the door 61. The door 61 and dependent wafer chuck 57 are axially translated by means of a pneumatic cylinder 68 operating on the actuator plate 62 via drive rod 69. The actuator plate 62 is guided on a pair of guide rods 71 and 72 via linear ball bearing assemblies 73 and 74 carried from the actuator plate 62 and riding on the rods 71 and 72, respectively. The guide rods 71 and 72 are carried from a plate 75 fixedly secured to the load lock end of the deposition chamber 12. The outer ends of the guide rod 71 and 72 are coupled together by means of a stabilizing plate 76.

An annular adapter plate 78 is sealed over the flanged opening 79 of the gate valve 15 and sealed thereto by an O-ring 81. Adapter plate 78 is centrally counter bored at 82 to provide a seat to receive an O-ring 83 carried by the door 61 for sealing the door 61 to the adapter 78.

A wafer clamping ring, 85, is concentrically disposed of the wafer chuck, 57, and includes a counter bore at 86 to receive the peripheral edge of the chuck, 57, concentrically therewithin. The counter bore region, 86, provides an inner lip portion which engauges the outer periphery of the wafer, 32, for clamping the wafer to the chuck, 57, in the absence of a vacuum applied via the retaining groove, 59, as will be the case when the chuck is operable within an evacuated chamber. Clamping ring, 85, is carried upon a plurality of axially directed stainless steel rods, 87, passing through linear ball bearing assemblies, 88, inserted within bores in the adaptor plate, 78. Springs, 89, are co-axially mounted surrounding the rods, 87, and are captured to the rod by means of screws, 91, threadably inserted into the ends of the rods, 87. The springs, 89, serve to spring bias the clamping ring, 85, toward the position of the wafer chuck, 57. Cylindrical caps, 92, are hermetically sealed over the rods, 87, and are carried from the adaptor plate, 78, for housing the springs, 89, and slidable rods, 87.

The clamping ring, 85, in the fully retracted position, nests within the counter bore regions, 93, of the adaptor plate, 78.

The wafer chuck, 57, includes an inner annular portion, 94, separated from an outer annular portion, 95, via the intermediary of a cup shaped insulating member, 96, so that the outer portion, 95, of the chuck may be operated at a potential independent of the potential of the chamber and the door, 61. For the purpose of applying the independent potential to the chuck portion, 95, a conductive rod, 97, depends axially from the chuck portion, 95, through an axial bore, 98, and into an axially directed hermetically sealed cylindrical cap, portion 99. The cap, 99, is transversally bored at 101 and an insulator cup, 102, is sealed over the bore, 101. An electrically conducted rod, 103 extends through the insulator body, 102, and has electrically conductive brush, 104, at the inner end thereof for riding on the rod, 97, for applying a bias potential to the rod and thus to the outer chuck portion, 95, independent of the potential applied to the bore and other structures within the chamber.

A magnetron sputter gun, 105, of conventional design such as that disclosed in U.S. Pat. No. 4,219,397 issued Aug. 26, 1980, the disclosure of which is hereby incorporated by reference in its entirety, is disposed within the chamber, 12, in axial alignment with the chuck, 57, and on the opposite side of the gate-valve, 15, from that of the door, 61.

The sputter gun, 105, includes an annular cathode member, 106, of material which is to be sputtered from the gun, 105. The cathode, 106, is operated at potential, as of $-V_c$ relative to ground potential. A disc shaped anode electrode, 107, is centrally disposed of the annular cathode electrode, 106, and is operated at a potential of $+V_a$ relative to ground potential. Insulator assemblies, 108 and 109, support the anode and cathode electrodes 107 and 106, respectively, from the envelope. A generally cup shaped sputter shield electrode, 110, as of stainless steel is disposed overlying the sputter gun, 105, and is operated at ground potential. The sputter shield includes an outwardly flared lip portion, 111, and is carried from the front surface of the conventional cup shaped ground shield electrode, 112, of the sputter gun. In a typical example, sputter shield, 110, is made of stainless steel and includes a central aperture, 113, in the bottom wall of the cup shaped shield member 110. The sputter shield 110 is carried from the gun shield 112 via a plurality of screws, 114.

The gate-valve, 115, is of a conventional design such as a Model 10046-PE40ss with a Viton bonnet seal and operable by means of a 24 volt D.C. solenoid. The valve is commercially available from HPS Corp., of Boulder, Colo. The valve, 115, includes a throat portion, 116, for gas communication between a load-lock portion 117 of the chamber and a wafer processing portion 118 of the evacuable chamber, 12. A movable gate-valve member 119 is transversely translated through the throat portion 116 of the valve body, 15, for valving off the load-lock portion 117 from the wafer processing portion 118.

In operation, with the gate-valve, 15, closed, the door, 61, is retracted to the open position, and the dependent chuck, 57, retracted by the pneumatic cylinder, 65, to the fully retracted position. A wafer, 32, to be processed is loaded, as previously described, by the elevator blade, 24, onto the wafer receiving major face, 58, of the chuck, 57, and held thereto via a vacuum drawn on annular groove, 59. The door, 61, is then shut by means of the action of the pneumatic cylinder, 68, with the O-ring, 83, making sealing engagement with the recessed seat portion 82 of the adaptor plate, 78, thus sealing the door portion of the chamber. After the door has been sealed, the chuck is advanced slightly into the load-lock portion 117 of the chamber, so as to cause the clamping ring, 85, to engage the peripheral edge of the wafer, 32, and to hold the wafer to the chuck, 57. When the chuck, 57, is brought into clamping relation with the clamping ring, 85, radially directed spring loaded ball bearings, 151, at the outer peripheral edge of the chuck, 57, engage and make electrical contact to the inside peripheral edge of the clamping ring, 85, at 122. This assures that the clamping ring, chuck and wafer are operating at the same potential, such as bias potential $-V_b$ applied via the brush, 104. Clamping ring, 85, is electrically insulated from the chamber wall and guide rods, 87, via the intermediary of insulated washers, 123, disposed surrounding the ends of the individual guide rods, 87.

With the wafer, 32, clamped to the chuck, 57, a mechanical roughing pump is connected into the load-lock chamber, 117, for evacuating the load-lock chamber, 117, to sub-atmospheric pressure. When a suitable sub-atmospheric pressure is achieved in the load-lock portion of the chamber, 117, the gate-valve, 115, is actuated and the gate-valve member 119 is withdrawn from the throat portion 116 for opening the throat in communication with the wafer processing portion 118 of the chamber which has previously been evacuated to a substantially high vacuum via the turbomolecular pump 17 communicating with the chamber via exhaust tubulation 18. Within a matter of a few seconds the wafer processing chamber 118 and the communicating load-lock portion 117 are evacuated to relatively low pressure as of $5 \times 10^{-6}$ torr. The turbomolecular pump 117 is backed up by a mechanical vacuum pump. Thereafter, the processing chamber 118 is backfilled with a suitable sputtering gas such as argon to a sputtering pressure of approximately $10^{-3}$ torr. After the gate-valve member 119 was withdrawn within the gate-valve 15, the wafer chuck 57 is advanced by the pneumatic cylinder 65 and rod 64 to a position closely spaced to the centrally apertured bottom wall 125 of the sputter shield 110. In a typical example, the axial spacing from the wafer, 32, to the end wall, 125, is approximately 0.100 inch. Moreover, the area of the wafer, 32, is substantially co-extensive with the cross-sectional area of the central aperture 113 in the sputter shield 110, such that all of the material sputtered from the sputter gun 105 is either collected on the wafer, exposed portion of the clamping ring, 85, or on the interior surfaces of the sputter shield 110. In the sputtering mode, the ionizing plasma discharge is ignited within the evacuated chamber. The potential of the plasma discharge is slightly positive with respect to ground, such that portions of the structure operating at ground potential and exposed to the plasma can experience sputtering. With the arrangement including the sputter shield 110 and with the wafer positioned substantially closing off the central aperture 113 in the shield 110, resputtering of material onto the wafer is essentially controlled; i.e., the material resputtered from the interior of the shield 110 can be sputtered onto the wafer, 32. This avoids contamination of the sputtered material on the wafer by materials resputtered from other portions of the chamber including the valve body 15 and other parts.

After the wafer, 32, has been sputter coated to the desired thickness, the plasma is extinguished, the wafer and chuck withdrawn via the pneumatic cylinder, 65, and shaft, 64, into the load-lock region, 117, of the chamber. The gate-valve, 15, is then closed for maintaining high vacuum in the wafer processing portion 118 of the chamber, and a vacuum is drawn on the chuck 57 via groove 59. The load-lock chamber is let up to atmospheric pressure and the door, 61, is opened for unloading the wafer onto the wafer elevator blade, 24, as previously described. In a typical operating sequence, a wafer can be loaded into the chamber, sputter coated, and returned to the wafer carrier, 29, in two minutes.

Referring now to FIG. 9 there is shown the wafer processing portion 118 of the vacuum chamber 12. More particularly, the cylindrical chamber 12 is outwardly flanged at 13 to provide an access port 126 through which the sputter gun 105 is axially inserted within the chamber 12. The access port 126 is closed and sealed by means of a centrally recessed access cover 127, carrying an O-ring 128, for making a vacuum tight seal to the flange 13. The sputter gun 105 is carried from the inner end of the reentrant cover plate 127. A hollow annular coldfinger 128 is disposed inside the chamber 12 surrounding the reentrant portion of the access cover 127 and is carried from an outwardly flanged portion of the cover 127 via the intermediary of fluid conduits 129, providing fluid communication between the annular interior of the coldfinger 128 and a source of liquid coolant, such as liquid nitrogen, not shown. The conduits 129 pass through axial bores 131 in the cover plate 127 and are hermetically sealed to the cover 127 via the intermediary of annular sealing washer 132. O-ring seals 133 and 134 are provided for sealing washer 132 to the conduit 129 and the washer 132 to the cover 127, respectively. In operation, the coldfinger 128 is filled with liquid nitrogen, bringing the temperature of the outer wall of the finger 128 to a temperature near liquid nitrogen temperature for condensing water vapor and other condensibles thereon, thus removing them from the atmosphere within the wafer processing portion 118 of the chamber.

Referring now to FIG. 10, the access cover 127 with its dependent coldfinger 128 and sputter gun 105 is carried from a slide block 135 via the intermediary of a right angle bracket 136. A foot portion 137 of the bracket 136 is pivotably pinned to the slide block 135 for rotation about a vertical axis 138 passing through the pin 139. The slide block 135 slides upon and is guided by a pair of stainless steel guide rods 141 disposed in the horizontal plane and each being parallel to the axis of revolution of the cylindrical chamber 12 and annular flange 13. Opposite ends of the guide rods 141 are anchored to the frame by means of support blocks 142. Maintenance and cleaning of the wafer coating machine 11 are facilitated by letting the wafer processing chamber up to atmospheric pressure and sliding the access cover plate 127 away from the chamber 12 on the guide rods 141. Then the cover plate with dependent gun can be rotated around axis 138 to facilitate access to the sputter gun 105 for replacing the cathode and cleaning the parts, particularly the sputter shield 110 and the cold finger 128. Also, referring now to FIG. 8, when the access cover 127 is opened, access is readily obtained to the clamping ring 85. The clamping ring, particularly that portion facing toward the sputter gun 105, receives substantial coating with the sputtered material and, therefore, it is desired to remove the coated portions of the clamping ring 85 for cleaning. This is accomplished by detaching an inner stainless steel portion 143 of the clamping ring 85 from the remaining portion of the ring 85. Removing the screws 144 allows detachment of the ring 143 for cleaning and replacement.

The advantages of the sputter coating machine 11 of the present invention include:

1. Ease of maintenance such that the uptime for the machine is substantially improved.

2. The machine has been substantially simplified so that it is less susceptible to breakdown and thus the uptime is improved with an attendant reduction in the manufacturing cost.

What is claimed is:

1. In a method for precisely locating the position of wafers within their respective carrying slots of a wafer carrier cassette of the type having slotted side walls for retaining an array of wafers in axially aligned an axially spaced relation and having an opening in the bottom and top of said wafer carrier for passage of a wafer pickup blade therethrough for moving wafers into and out of said wafer carrier, the step of:

inserting and indexing means with a precisely determined pitch through the open bottom of said wafer carrier to pick up and position the bottom edge of said wafers within respective ones of said slots within said wafer carrier, whereby movement of said wafers by said blade is facilitated in use.

2. In a wafer processing machine for processing wafers of the type wherein wafers in a wafer carrier open on the top and bottom and having slots on the side walls for holding the wafers are transported to or from the wafer carrier relative to a wafer process station:

wafer pickup means passing transversely through the wafer carrier from the bottom for engagement with the wafers for transport of the wafers relative to the wafer process station; and indexing means extending through the bottom wall of said wafer carrier for engagement with the bottom edges of said wafers for raising said wafers slightly and precisely determining their axial position within the respective wafer holding slots, whereby movement by the wafer pickup blade is facilitated in use.

3. The machine of claim 2 wherein said indexing means includes an indexing member having a saw tooth structure disposed along an upper edge thereof with the pitch of the teeth of said saw tooth being such as to precisely define the axial separation of the wafers engaged and lifted by the saw tooth structure.

4. In a wafer processing machine of the type wherein wafers are processed in an evacuable wafer processing chamber at sub-atmospheric pressure, the chamber having a wafer access port in a wall thereof;

door means closing and sealing the wafer access port of the wafer processing chamber;

wafer chuck means carried from said door means for movement therewith and operable within the chamber for holding the wafer in position for processing;

gate valve means within the evacuable chamber for valving off a load lock portion of the chamber relative to a processing portion of the chamber by moving a gate member across a throat portion said valve means, said throat portion being interposed between said load lock and processing portions of said chamber;

means for opening said gate valve means by translating said gate member out of said throat portion; and chuck translating means operatively associated with said chuck means for translating said chuck means and wafer into the open throat of said gate valve means from said load lock portion of said chamber.

5. The machine of claim 4 wherein said chuck translating means translate said chuck and wafer through the open throat of said gate valve member into said processing portion of the chamber.

6. The machine of claim 4 including, sputtered gun means within said processing portion of the chamber for sputtering material onto the wafer as carried from said chuck means.

7. In a wafer processing machine of the type wherein wafers are processed in an evacuable wafer processing chamber at sub-atmospheric pressure, the chamber having a wafer access port in a wall thereof;

door means for closing and sealing the wafer access port of the wafer processing chamber;

sputter gun means having anode and cathode electrodes for producing an ionizing plasma discharge within the wafer processing chamber at sub-atmospheric pressure for sputtering material from said cathode electrode of said sputter gun into the chamber;

chuck means for positioning a workpiece within the chamber to receive a coating of the material sputtered from said sputter gun means; and sputter shield means separate from the wall of the chamber and surrounding the plasma between said sputter gun and the workpiece, as positioned by said chuck means, for collecting sputtered material projected away from said sputtered gun means and not collected by the workpiece.

8. The apparatus of claim 7, wherein said sputter shield means includes a side wall portion surrounding the lobe of material being sputtered from said sputter gun means and having an inwardly directed centrally apertured end wall portion distal from said sputter gun means; and wherein said chuck means positions the workpiece so as to be generally coextensive with the area of said central aperture in said shield means, whereby a preponderance of the material sputtered by said sputter gun means is collected by said sputter shield means and the workpiece.

9. The machine of claim 8 including means for carrying said shield means from said sputter gun means.

10. The machine of claim 8 including electrical insulator means for electrically insulating said sputter shield means relative to the potential of said anode and cathode electrodes of said sputter gun means.

11. In a wafer processing machine of the type wherein wafers are coated in an evacuable wafer processing chamber at sub-atmospheric pressure:

said wafer processing chamber having an access port in a wall of the chamber;

cover means for closing and sealing said access port;

gun means carried from said cover means and extending into the chamber for projecting material onto the workpiece to be coated within the chamber;

coldfinger means carried from said cover means and extending into said chamber for operation at sub-ambient temperature for condensation of water vapor and other condensibles within the chamber; and fluid conduit means communicating through said cover means for supplying coolant to said coldfinger means within the chamber.

12. The machine of claim 11 wherein said coldfinger means is generally arcuate and disposed generally concentric with and outside of said gun means.

* * * * *